United States Patent
Wang et al.

(10) Patent No.: US 9,111,871 B2
(45) Date of Patent: Aug. 18, 2015

(54) SEMICONDUCTOR STRUCTURE AND METHOD FOR FORMING THE SAME

(71) Applicant: Semiconductor Manufacturing International (Shanghai) Corporation, Shanghai (CN)

(72) Inventors: Xinpeng Wang, Shanghai (CN); Xianjie Ning, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/340,015

(22) Filed: Jul. 24, 2014

(65) Prior Publication Data

US 2015/0145017 A1 May 28, 2015

(30) Foreign Application Priority Data

Nov. 27, 2013 (CN) .......................... 2013 1 0617911

(51) Int. Cl.
| H01L 21/306 | (2006.01) |
|---|---|
| H01L 29/66 | (2006.01) |
| H01L 29/788 | (2006.01) |
| H01L 29/423 | (2006.01) |
| H01L 29/49 | (2006.01) |
| H01L 21/762 | (2006.01) |
| H01L 21/02 | (2006.01) |
| H01L 21/321 | (2006.01) |

(52) U.S. Cl.
CPC ...... *H01L 21/30608* (2013.01); *H01L 21/0217* (2013.01); *H01L 21/02164* (2013.01); *H01L 21/02334* (2013.01); *H01L 21/306* (2013.01); *H01L 21/3212* (2013.01); *H01L 21/762* (2013.01); *H01L 21/76224* (2013.01); *H01L 29/42328* (2013.01); *H01L 29/4916* (2013.01); *H01L 29/66825* (2013.01); *H01L 29/788* (2013.01)

(58) Field of Classification Search
CPC .............. H01L 21/76; H01L 21/76224; H01L 21/823437; H01L 21/762
See application file for complete search history.

(56) References Cited

U.S. PATENT DOCUMENTS

| 6,228,713 B1* | 5/2001 | Pradeep et al. ............... 438/257 |
|---|---|---|
| 2001/0024858 A1* | 9/2001 | Schulz et al. .................. 438/268 |
| 2004/0084719 A1* | 5/2004 | Hsieh ............................. 257/317 |
| 2007/0114592 A1* | 5/2007 | Soss et al. ...................... 257/316 |
| 2008/0102595 A1* | 5/2008 | Lee et al. ....................... 438/396 |
| 2009/0098734 A1* | 4/2009 | Chuang .......................... 438/693 |
| 2013/0323920 A1* | 12/2013 | Chang et al. .................. 438/586 |
| 2015/0069466 A1* | 3/2015 | Chang et al. .................. 257/192 |

* cited by examiner

*Primary Examiner* — Eduardo A Rodela
(74) *Attorney, Agent, or Firm* — Anova Law Group, PLLC (57) ABSTRACT

Various embodiments provide semiconductor structures and methods for forming the same. In an exemplary method, a substrate can be provided. The substrate can have a plurality of isolation structures. A top surface of the plurality of isolation structures can be higher than a surface of the substrate. A device layer can be formed on the substrate and on the plurality of isolation structures. The device layer can be polished using a polishing process, such that the top surface of the plurality of isolation structures are exposed, with residue remaining on the device layer and on the plurality of isolation structures. The residue can be removed from the device layer and from the plurality of isolation structures using a non-polishing-removal process, such that the top surface of the plurality of isolation structures and a top surface of the device layer are substantially leveled and smooth.

20 Claims, 5 Drawing Sheets

SEMICONDUCTOR STRUCTURE AND METHOD FOR FORMING THE SAME

CROSS-REFERENCES TO RELATED APPLICATIONS

This application claims priority to Chinese Patent Application No. CN201310617911.4, filed on Nov. 27, 2013, the entire contents of which are incorporated herein by reference.

FIELD OF THE DISCLOSURE

The present disclosure relates to the field of semiconductor fabrication technology and, more particularly, relates to semiconductor structures and methods for forming the same.

BACKGROUND

In current semiconductor industry, integrate circuit (IC) products are classified into three major types including analog circuit, digital circuit, and digital/analog hybrid circuit. Memory device is an important type of device in digital circuit. In recent years, flash memory, as a memory device, has been developed rapidly. A main feature of the flash memory is capability of long-term information storage without electric power. Flash memory also has some advantages including high degree of integration, fast write/access speed, and easy erase and rewrite operations. Therefore, flash memory has been widely applied to various fields such as microcomputer and automatic control.

Figure 1:
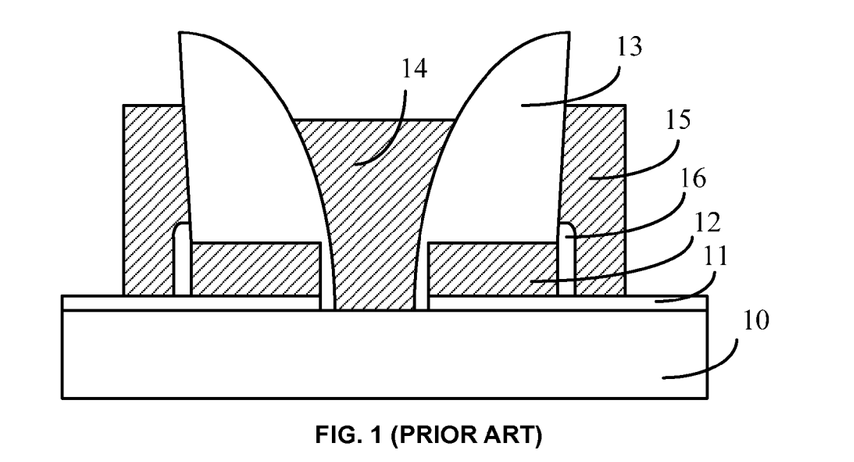
FIG. 1 depicts a cross section of an existing flash memory.

FIG. 1 depicts a cross section of an existing flash memory storage unit (or flash memory cell). The cell includes a substrate 10, a tunneling oxide layer 11 on the surface of the substrate 10, and a floating gate 12 on the surface of the tunneling oxide layer 11. An opening is formed in the tunneling oxide layer 11 and in the floating gate 12 to expose the substrate 10. The cell further includes sidewall spacers 13 on the top surface of the floating gate 12 and covering sidewalls of the opening. The cell further includes a source line layer 14 on the surface of the substrate 10 at the bottom of opening. The source line layer 14 covers a portion of the surface of the sidewall spacers 13, and the surface of the source line layer 14 is not higher than the top of the sidewall spacers 13. Furthermore, the cell includes a word line layer 15 located outside the sidewall spacers 13, the source line layer 14, and the floating gate 12. The word line layer 15 is electrically isolated from the floating gate 12 by an insulating layer 16.

Figure 2:
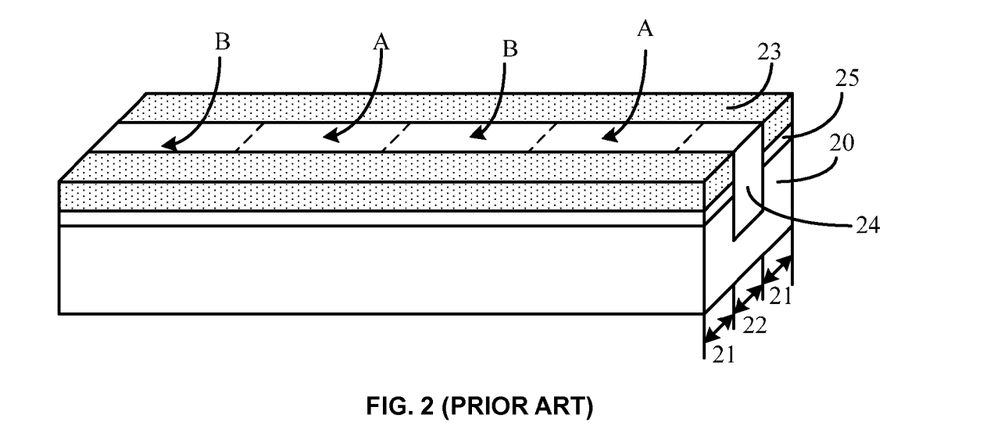
FIG. 2 depicts an isolation structure for isolating a floating gate of a flash memory cell.

Floating gates of multiple flash memory cells formed on the same substrate need to be electrically isolated by isolation structures. FIG. 2 depicts an isolation structure for isolating a floating gate of a flash memory cell. The flash memory cell includes a substrate 20 having a floating gate region 21 and an isolation region 22, a tunneling oxide layer 25 on the surface of the substrate 20 at the floating gate region 21, and a floating gate layer 23 on the surface of the tunneling oxide layer 25. The flash memory cell further includes an isolation structure 24 in the substrate 20 at the isolation region 22. The isolation structure 24 includes a first region A and a second region B. The first region A and the second region B are adjacent to each other. A source line layer, such as the source line layer 14 as shown in FIG. 1, stretches across the first region A of the isolation structure 24. A portion of the floating gate layer 23 corresponding to the second region B of the isolation structure 24 is removed by etching in a subsequent process.

However, the floating gate layer and the isolation structure formed by existing technology often have poor morphology, so the performance of the subsequently-formed flash memory cell is often unstable. The disclosed methods and structures are directed to solve one or more problems set forth above and other problems.

BRIEF SUMMARY OF THE DISCLOSURE

One aspect of the present disclosure includes methods for forming a semiconductor structure. In an exemplary method, a substrate can be provided. The substrate can have a plurality of isolation structures. A top surface of the plurality of isolation structures can be higher than a surface of the substrate. A device layer can be formed on the substrate and on the plurality of isolation structures. The device layer can be polished using a polishing process, such that the top surface of the plurality of isolation structures are exposed, with residue remaining on the device layer and on the plurality of isolation structures. The residue can be removed from the device layer and from the plurality of isolation structures using a non-polishing-removal process, such that the top surface of the plurality of isolation structures and a top surface of the device layer are substantially leveled and smooth.

Another aspect of the present disclosure includes semiconductor structures. An exemplary semiconductor structure includes a substrate, a device layer on the substrate, and a plurality of isolation structures passing through the substrate and through the device layer. The device layer can be formed on the substrate by performing a process including the following steps. The substrate can be provided. The substrate can have the plurality of isolation structures. A top surface of the plurality of isolation structures can be higher than a top surface of the substrate. The device layer can be formed on the substrate and on the plurality of isolation structures. The device layer can be polished using a polishing process, such that the top surface of the plurality of isolation structures are exposed, with residue remaining on the device layer and on the plurality of isolation structures. The residue can be removed from the device layer and from the plurality of isolation structures using a non-polishing-removal process, such that the top surface of the plurality of isolation structures and a top surface of the device layer are substantially leveled and smooth.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Floating gate layer and isolation structure formed by existing technology often have poor morphology, so the performance of a subsequently-formed flash memory cell is often unstable.

Figure 3:
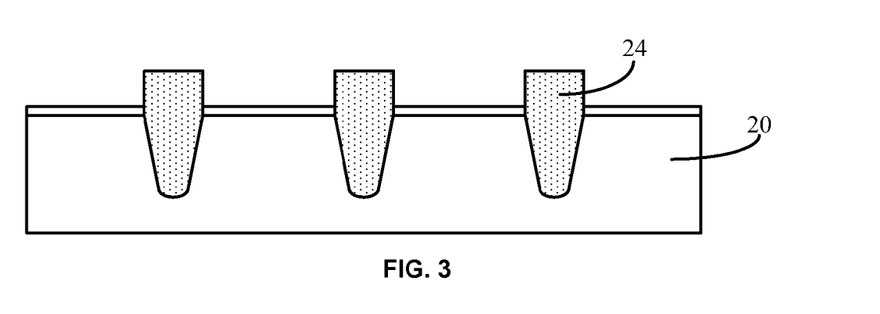
FIGS. 3-5 depict cross-sectional views of a floating gate layer and an isolation structure at various stages of a fabrication process.
Figure 4:
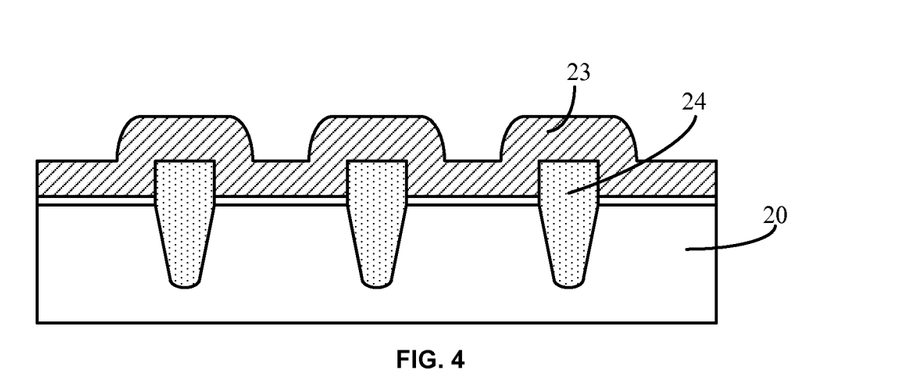
Figure 5:
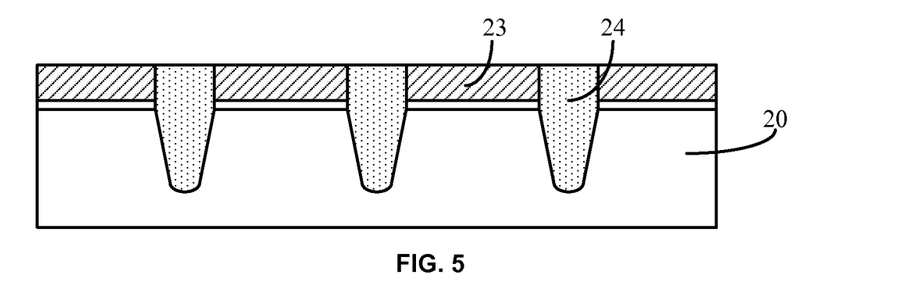

FIGS. 3-5 depict cross-sectional views of a floating gate layer and an isolation structure at various stages of a fabrication process. Referring to FIG. 3, a substrate 20 is provided. The substrate 20 can have a plurality of isolation structures 24 therein. The surface of the isolation structures 24 is higher than the surface of the substrate 20.

Referring to FIG. 4, a floating gate layer 23 is formed on the surface of the substrate 20 and the isolation structures 24 using a deposition process. Referring to FIG. 5, the floating gate layer 23 is polished using a chemical mechanical polishing (CMP) process until the top surface of the isolation structures 24 is exposed.

The chemical mechanical polishing process can include a first polishing process and a second polishing process. In the first polishing process, the floating gate 23 and the isolation structure 24 have substantially the same polishing rate, and the polishing rate is relatively high. Thus, the thickness of the floating gate layer 23 can be thinned by a relatively great amount, such that the surface of the floating gate layer 23 can be close to the top surface of the isolation structure 24.

In the second polishing process, the floating gate 23 and the isolation structure 24 have substantially the same polishing rate, and the polishing rate is relatively low. Thus, the surface of the floating gate layer 23 can be gradually closer to the top surface of the isolation structure 24 until the top surface of the isolation structure 24 is exposed. The low polishing rate can ensure that the second polishing process can stop substantially at the surface of the isolation structure 24.

However, because the polishing rate for the floating gate layer 23 is substantially the same as the polishing rate for the isolation structure 24 during the first polishing process and the second polishing process, there tend to be residual material of the floating gate layer 23 on the surface of the isolation structure 24. The residual material of the floating gate layer 23 may cause electric leakage between adjacent floating gate layers 23, and thus affecting performance of a subsequently-formed flash memory cell.

Thus, after the second polishing process, a third polishing process is often needed. During the third polishing process, the polishing rate for the floating gate 23 is higher than the polishing rate for the isolation structure 24, so the residual material of the floating gate layer 23 on the surface of the isolation structure 24 can be removed. However, at the same time, the third polishing process can reduce the thickness of the floating gate layer 23. Thus, size of the floating gate layer 23 can be difficult to precisely control. Moreover, polishing rate of a chemical mechanical polishing process at wafer center and at wafer edge may be inconsistent, and the polishing rate for the floating gate 23 is relatively high during the third polishing process. Therefore, after the third polishing process, size of the floating gate layer 23 at wafer center tends to be inconsistent with size of the floating gate layer 23 at wafer edge, thus resulting in poor uniformity and unstable performance of subsequently-formed flash memory cells.

In order to solve the one or more problems set forth above and other problems, various embodiments provide a method for forming a semiconductor structure. The method can be used for forming a floating gate in a flash memory cell. In an exemplary method, after a device layer on the surface of a substrate and an isolation structure is polished using a polishing process and the surface of the isolation structure is exposed, residual material on the surface of the device layer and the isolation structure can be removed using a dry treatment process. Because the polishing rate for the device layer and the polishing rate for the isolation structure are substantially the same during the polishing process, there can be residual material from the device layer (or the floating gate layer) remaining on the surface of the isolation structure. The dry treatment process can remove the residual material on the surface of the isolation structure. Thus, desired electrical isolation between adjacent device layers can be ensured. At the same time, the dry treatment process can remove the residual material on the surface of the isolation structure. Thus, size of the device layer is substantially unaffected, and uniformity of device layers over the surface of an entire wafer surface can be improved. Further, after the dry treatment process, the surface of the isolation structure and of the device layer can be smooth, which is beneficial for performing subsequent processes on the surface of the isolation structure and of the device layer.

Figure 11:
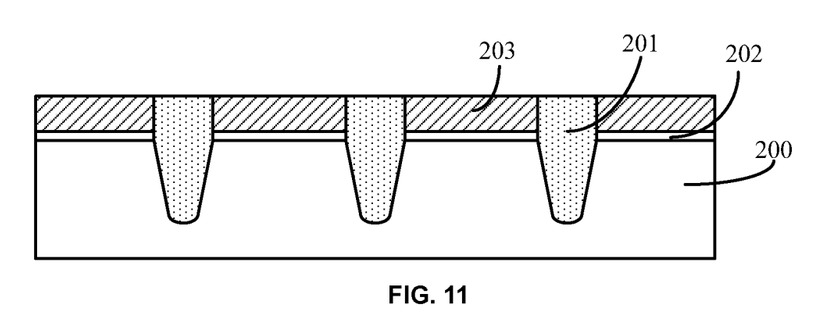
Figure 12:
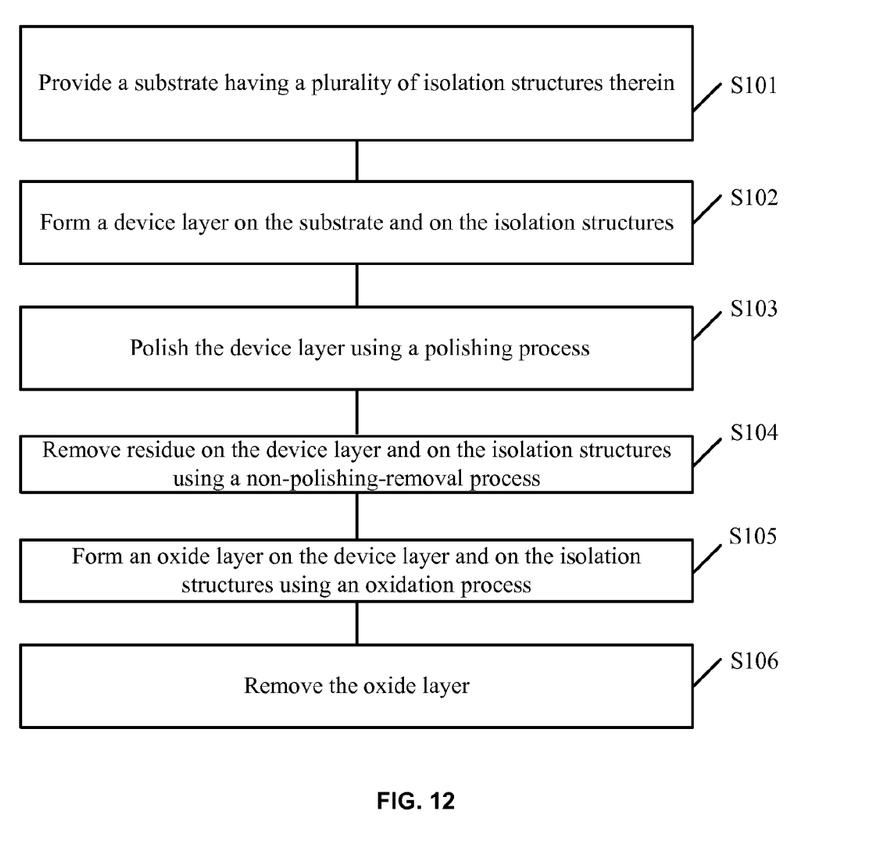
FIG. 12 depicts a flow diagram of an exemplary method for forming a semiconductor structure in accordance with various disclosed embodiments.

FIG. 12 depicts a flow diagram of an exemplary method (or process) for forming a semiconductor structure in accordance with various disclosed embodiments. FIGS. 6-11 depict cross-sectional views of a semiconductor structure at various stages during fabrication in accordance with various disclosed embodiments. Note that although FIGS. 6-11 depict double patterns corresponding to the method depicted in FIG. 12, the semiconductor structures and the method are not limited to one another in any manner.

As used herein, a device layer as described in FIG. 12 can also be referred to as a floating gate layer. 'Surface of the device layer' can be used interchangeably with 'top surface of the device layer'. 'Surface of the isolation structure' can be used interchangeably with 'top surface of the isolation structure'. 'Residual material' can also be referred to as residue.

Figure 6:
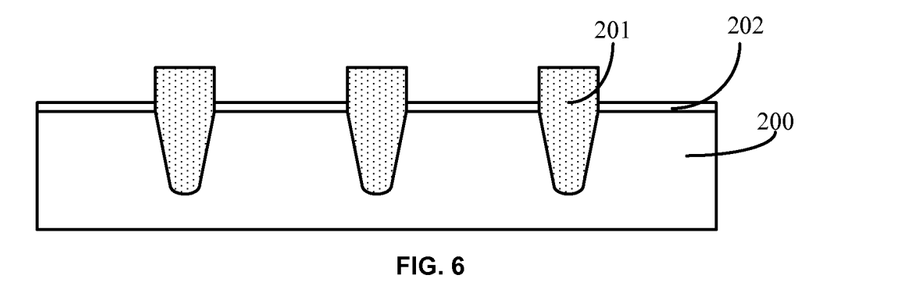
FIGS. 6-11 depict cross-sectional views of a semiconductor structure at various stages during fabrication in accordance with various disclosed embodiments.

In Step S101 of FIG. 12 and referring to FIG. 6, a substrate 200 is provided. The substrate 200 has a plurality of isolation structures 201 therein. The surface of the isolation structures 201 is higher than the surface of the substrate 200.

The substrate 200 can be used for providing a working platform for subsequent processes. The substrate 200 can include a silicon substrate, a silicon-germanium substrate, a silicon carbide substrate, a silicon-on-insulator (SOI) substrate, a germanium-on-insulator (GOI) substrate, a glass substrate, or a III-V group compound substrate, e.g., gallium nitride or gallium arsenide, and/or any other appropriate substrate.

The substrate 200 can have an active region. A surface of the active region can be used for forming an active device. In one embodiment, a subsequently-formed device layer can be used to form a floating gate in a flash memory cell. A source region and a drain region of the flash memory cell can be formed in the active region.

The isolation structures 201 can be made of a material that is, e.g., silicon oxide, silicon nitride, silicon oxynitride, and/or any other appropriate materials. The isolation structures 201 can be used to isolate floating gate layers on the surface of adjacent floating gate regions and the active regions in the substrate 200.

For example, a process of forming the isolation structures 201 can include the following steps. A mask layer can be formed on the surface of the substrate 200. The mask layer can expose positions corresponding to the isolation structures 201 to be formed. The substrate 200 can then be etched using the mask layer as an etch mask, to form trenches in the substrate 200. An isolation layer can be formed in the trenches to substantially fill the trenches. The isolation layer can be polished until the surface of the mask layer is exposed, to form the isolation structures 201 in the trenches. After the process of polishing the isolation layer, the mask layer can be removed.

In one embodiment, the subsequently-formed device layer can be the floating gate in the flash memory cell. Thus, after the device layer is subsequently formed, a source line and a word line need to be formed across the surface of a portion of the isolation structure 201.

The mask layer can be used to define positions of the isolation structures 201 and shape of the top of the isolation structures 201. In addition, the mask layer can occupy space for the subsequently-formed device layer, and thus can define structure and size of the device layer.

In one embodiment, the mask layer can be made of a material that is, e.g., silicon nitride. For example, a process of forming the mask layer can include the following steps. A mask film can be formed on the surface of the substrate 200. A patterned layer can be formed on the surface of the mask film. The patterned layer can define corresponding positions for the isolation structures 201 to be formed. The mask film can be etched using an anisotropic dry etching process, using the patterned layer as an etch mask, to form the mask layer. The patterned layer can be formed using a photolithography process, a nano printing process, a directed self-assembly process, a self-aligned multiple patterning process, and/or any other appropriate process.

A dry treatment process is performed on the device layer and the isolation structures 201 after the device layer is subsequently polished, and the dry treatment process can thin or reduce the thickness of the device layer and the isolation structures 201. Therefore, to ensure the thickness of the device layer to reach a preset thickness after the dry treatment process, a distance between the top surface of the isolation structures 201 and the surface of a second dielectric layer 202 needs to be greater than the preset thickness of the device layer. In one embodiment, the distance between the top surface of the isolation structures 201 and the surface of the second dielectric layer 202 can be greater than the preset thickness of the device layer 203 by a thickness difference ranging from about 50 Å to about 150 Å.

In one embodiment, a second dielectric layer 202 can be formed between the mask layer and the substrate 200. The second dielectric layer 202 can be made of a material, e.g., silicon oxide. The second dielectric layer 202 can be formed by a chemical vapor deposition (CVD) process, an atomic layer deposition (ALD) process, and/or a thermal oxidation process. The second dielectric layer 202 can protect the surface of the substrate 200 from damage when the mask layer is removed. In addition, the subsequently-formed device layer can be used to form the floating gate in the flash memory cell, so the second dielectric layer 202 can be used as a tunneling oxide layer between the floating gate and the substrate 200. During operation of the subsequently-formed flash memory cell, a channel region can be formed in the substrate 200 at the bottom of the floating gate. Carriers can pass through the second dielectric layer 202 to achieve migration between the channel region and the floating gate, in order to accomplish write, erase, programming, or any other appropriate operations.

Figure 7:
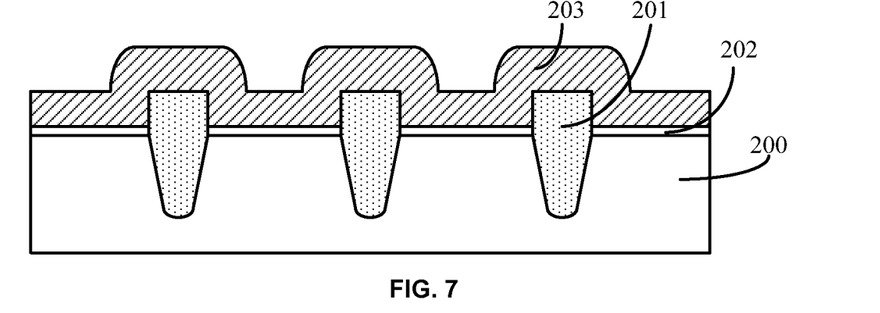

In Step S102 of FIG. 12 and referring to FIG. 7, a device layer 203 is formed on the surface of the substrate 200 and the surface of the isolation structures 201. In one embodiment, the device layer 203 can be used for forming a floating gate in a flash memory cell. The device layer 203 can be made of a material, e.g., polysilicon. In other embodiments, the device layer 203 can be made of a material such as a metal or an insulating material.

The device layer 203 can be formed using a deposition process including, e.g., a chemical vapor deposition process, and/or a physical vapor deposition process. To ensure the surface of the device layer 203 is substantially leveled with the surface of the isolation structures 201 after a subsequent polishing process, the thickness of the device layer 203 formed using the deposition process can be greater than or equal to the distance between the top surface of the isolation structures 201 and the surface of the second dielectric layer 202. As used herein, wherever applicable, 'leveled' can refer to 'in substantially the same plane with each other'.

Figure 8:
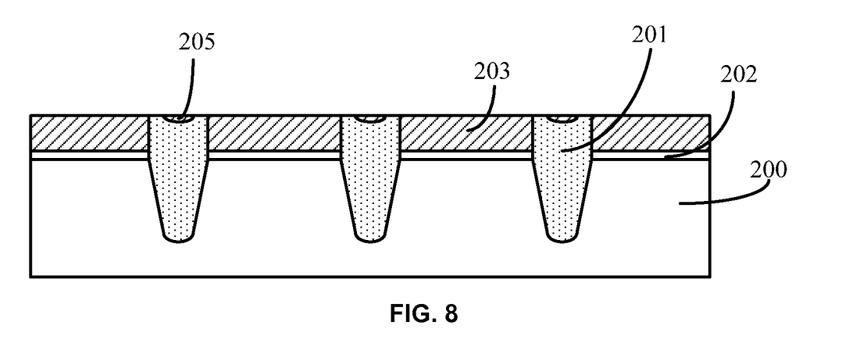

In Step S103 of FIG. 12 and referring to FIG. 8, the device layer 203 is polished using a polishing process. During the polishing process, the polishing rate for the device layer 203 can be substantially the same as the polishing rate for the isolation structures 201.

The polishing process can be used for removing the device layer 203 above, i.e., higher than, the top of the isolation structures 201 and expose the top surface of the isolation structures 201. In various embodiments, a plurality of device layers 203 can be formed after the device layer 203 (e.g., as shown in FIG. 7) is polished by the polishing process. Thus, whenever appropriate, the device layer 203 can also be referred to as device layers 203.

In one embodiment, in order to ensure that the polishing process stops at the top surface of the isolation structures 201, i.e., stops when the top surface of the isolation structures 201 is exposed, without causing excessive damage to the top surface of the isolation structures 201, and to further ensure a precise and accurate thickness of the device layer 203 formed between adjacent isolation structures 201, the polishing process can include a first polishing process and a second polishing process after the first polishing process. The polishing rate during the first polishing process can be greater than the polishing rate during the second polishing process.

The polishing rate during the first polishing process can range from about 5 Å/sec to about 20 Å/sec. After the first polishing process, a distance between the surface of the device layer 203 above the isolation structures 201 and the surface of the isolation structures 201 can range from about 100 Å to about 800 Å. During the first polishing process, the polishing rate for the device isolation layer 203 can be substantially the same as the polishing rate for the isolation structures 201. That is, there can be substantially no polishing selectivity, i.e., can be a polishing selection ratio of about 1, between the device layer 203 and the isolation structures 201. The polishing rate during the first polishing process can be relatively high, such that the surface of the device layer 203 can rapidly approach the surface of the isolation structures 201.

After the first polishing process, the second polishing process can be performed. The polishing rate during the second polishing process can range from about 1 Å/sec to about 5 Å/sec. The second polishing process can be used for exposing the top surface of the isolation structures 201. Because the polishing rate for the device layer 203 can be substantially the same as the polishing rate for the isolation structures 201 during the second polishing process, the surface of the device layer 203 and of the isolation structures 201 can be smooth and leveled. Thus, the thickness of the device layer 203 can be uniform. In addition, the polishing rate during the second polishing process can be relatively low. Therefore, the surface of the device layer 203 can slowly approach the surface of the isolation structures 201, and damage to the top surface of the isolation structures 201 can be reduced.

However, because the polishing rate for the device layer 203 can be substantially the same as the polishing rate for the isolation structures 201 during the first polishing process and the second polishing process, residue 205 tends to be attached to the surface of the device layer 203 and the surface of the isolation structures 201. The residue 205 can include material of the device layer 203.

The residue 205 located on the surface of the isolation structures 201 can cause electric leakage between adjacent device layers 203, and can thus result in undesirable electrical performance of a subsequently-formed semiconductor structure. Further, the residue 205 on the surface of the device layers 203 can cause the size of the device layers 203 to be non-uniform, and thus cause the performance of the device layer 203 to be unstable.

Therefore, a dry treatment process may be needed to remove the residue 205 on the surface of the device layer 203 and of the isolation structures 201. In one embodiment, the device layer 203 can be made of a material, e.g., polysilicon. Accordingly, the residue 205 can be made of a material containing polysilicon, or a material containing silicon.

Figure 9:
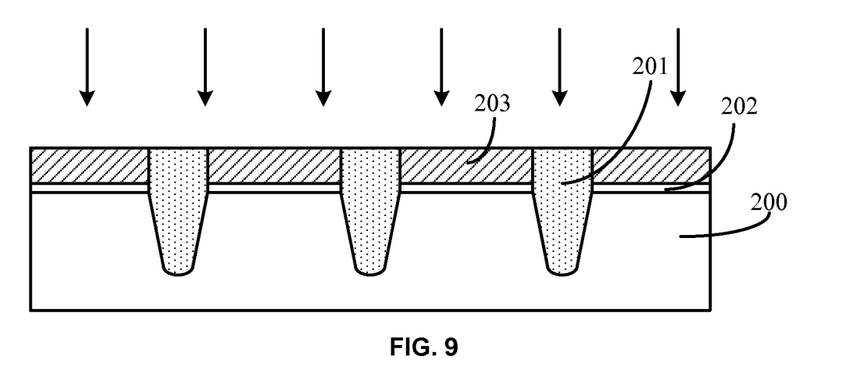

In Step S104 of FIG. 12 and referring to FIG. 9, after the polishing process, the residue 205 (e.g., as shown in FIG. 8) on the surface of the device layer 203 and of the isolation structures 201 is removed using a dry treatment process. During the dry treatment process, the etching rate for the device layer 203 can be substantially the same as the etching rate for the isolation structures 201. Therefore, a thickness amount of the device layer 203 that is thinned can be substantially the same as a thickness amount of the isolation structures 201 that is thinned. As a result, after the dry treatment process, the surface of the device layer 203 and the surface of the isolation structures 201 can be substantially smooth and substantially leveled.

For illustrative purposes, the residue 205 on the surface of the device layer 203 and of the isolation structures 201 is removed using a dry treatment process. However, a process for removing the residue 205 is not limited to a dry treatment process. The process for removing the residue 205 can include any appropriate wet etching process and/or dry etching process, such that the etching rate for the device layer 203 can be substantially the same as the etching rate for the isolation structures 201. Thus, the surface of the device layer 203 and of the isolation structures 201 can be smooth and leveled after the residue 205 is removed. In addition, during the process, the residue 205 can be removed from the surface of the device layer 203 and the isolation structures 201 by a process gas or a process liquid the residue 205 is exposed to.

Thus, as disclosed in various embodiments, the process for removing the residue 205 can include a non-polishing-removal process. The non-polishing-removal process can be any appropriate process that is not, or not equivalent to, a polishing process (e.g., the third polishing process as described in FIG. 5). In certain embodiments, the non-polishing-removal process can be, e.g., a dry treatment process. The processing effects and results accomplished by a non-polishing-removal process can be similar to, or substantially the same as, the effects and results accomplished by a dry treatment process as depicted in various embodiments.

When the dry treatment process is used for removing the residue 205, during the dry treatment process, a process gas can bombard the residue 205, and can carry the residue 205 away from the surface of the device layer 203 and the isolation structures 201 via the flow of the process gas. In one embodiment, the residue 205 can include polysilicon. The process gas of the dry treatment process can include a fluorine-containing gas. In one embodiment, the process gas can include Ar, He, $CF_4$, and $CHF_3$. The Ar can have a flow rate ranging from about 100 sccm to about 800 sccm, the He can have a flow rate ranging from about 50 sccm to about 200 sccm, the $CF_4$ can have a flow rate ranging from about 20 sccm to about 300 sccm, and the $CHF_3$ can have a flow rate ranging from about 10 sccm to about 200 sccm.

The dry treatment process can further thin or reduce the thickness of the device layer 203 and the isolation structure 201. The respective thickness of the device layer 203 and the isolation structure 201 after the thinning can be less than the respective thickness of the device layer 203 and the isolation structure 201 by a thickness amount ranging from about 30 Å to about 80 Å, in order to ensure that the dry treatment process can completely remove the residue 205. In one embodiment, the distance between the top surface of the isolation structures 201 and the surface of the second dielectric layer 202 can be greater than the preset thickness of the device layer 203. That is, after the second polishing process, the thickness of the device layer 203 can be greater than the preset thickness. Therefore, after the dry treatment process, the thickness of the device layer 203 can reach the preset thickness, and size of the device layer 203 can be uniform.

In one embodiment, in order to ensure complete removal of the residue 205, after the dry treatment process, an oxidation process and a cleaning process can be performed on the surface of the device layer 203.

In another embodiment, after the dry treatment process, a first dielectric layer can be formed on the surface of the device layer 203. A control gate, a word line layer, or a source line layer can be formed on the surface of the first dielectric layer. The control gate, the word line layer, and the source line layer can be used for forming a flash memory cell.

In one embodiment, a word line layer can be formed on the first dielectric layer. The word line layer can then be patterned using any appropriate methods, e.g., photolithography followed by an etching process, to form a control gate on the first dielectric layer that is above the device layer 203. The control gate can also be referred to as a word line layer.

In another embodiment, a source line layer can be formed on the first dielectric layer. The source line layer can then be patterned using any appropriate methods, e.g., photolithography followed by an etching process, to connect the source region of the flash memory cell to a common ground. The location of the patterned source line layer can depend on needs of practical applications.

In one example, the patterned source line layer can be located on the first dielectric layer and between two adjacent device layers 203. In another example, the patterned source line layer does not have the first dielectric layer underneath, and the patterned source line layer can be directly located on the isolation structure 201 between two adjacent device layers 203. That is, in this case, the first dielectric layer can be patterned previously to expose the surface of the isolation structure 201. The source line layer can then be formed and patterned to be directly located on the isolation structure 201. In another example, the source line layer can be formed directly on the substrate, be located between two adjacent device layers (or floating gate), and be isolated from the two adjacent device layers by sidewall spacers (e.g., as shown in FIG. 1).

For example, the first dielectric layer can be formed using a chemical vapor deposition process. The first dielectric layer can include a first silicon oxide layer, a silicon nitride layer on the surface of the first silicon oxide layer, and a second silicon oxide layer on the surface of the silicon nitride layer. Because the surface of the device layer 203 and the isolation structures 201 is substantially flat, leveled and smooth, and has substantially no residual material (e.g., the residue 205), the formed first dielectric layer can be uniform and dense, and can be ensured to have desirable electrical isolation performance.

Figure 10:
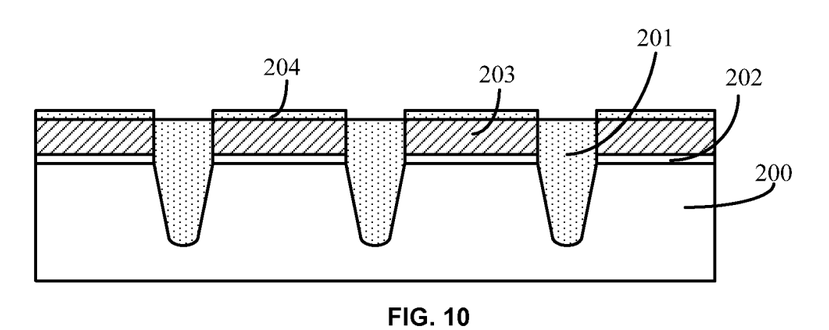

In Step S105 of FIG. 12 and referring to FIG. 10, optionally, after the dry treatment process, an oxide layer 204 is formed on the surface of the device layer 203 and/or the isolation structures 201 using an oxidation process. The oxidation process can include, e.g., a thermal oxidation process.

The formation of the oxide layer 204 may depend on the material that the isolation structures 201 are made of. In one embodiment, the oxide layer 204 can be formed on the device layer 203. In another embodiment, the oxide layer 204 can be formed on the device layer 203 and on the isolation structures 201.

The oxide layer 204 can be formed on the device layer 203 and the isolation structures 201 by the thermal oxidation process, such that the residue 205 attached to the surface of the device layer 203 and to the isolation structures 201 can be oxidized, in order to further remove the residue 205. Thus, cleanness and purity of the surface of the device layer 203 and the surface of the isolation structures 201 can be ensured. In addition, the thickness of the oxide layer 204 can be controlled by the oxidation process, and can be uniform. Therefore, after the oxidation process, the thickness of the device layer 203 can be ensured to be accurate and uniform.

In one embodiment, the device layer 203 can be made of a material, e.g., polysilicon. The formed oxide layer 204 can be made of a material, e.g., silicon oxide. The oxide layer 204 can have a thickness ranging from about 10 Å to about 40 Å.

In Step S106 of FIG. 12 and referring to FIG. 11, optionally, after the oxidation process, the oxide layer 204 (e.g., as shown in FIG. 10) is removed. In one embodiment, a process for removing the oxide layer 204 can include a wet cleaning process. The wet cleaning process can have a selectivity for the device layer 203 and the oxide layer 204. For example, during the wet cleaning process the etching rate for the device layer 203 can be higher than the etching rate for the oxide layer 204. Thus, the wet cleaning process can ensure that the surface of the device layer 203 is not damaged at the same time of removing the oxidation layer 204. Therefore, the surface of the device layer 203 can be substantially smooth and flat. In addition, the size of the device layer 203 can be accurate and uniform. In one embodiment, the oxide layer 204 can be made of a material, e.g., silicon oxide. In this case, the wet cleaning process can use a cleaning liquid including hydrofluoric acid. In another embodiment, the process for removing the oxide layer 204 can include a dry etching process.

Optionally, after the wet cleaning process following the dry treatment process, a first dielectric layer can be formed on the surface of the device layer 203. The first dielectric layer can be formed using a chemical vapor deposition process and/or a physical vapor deposition process. The first dielectric layer can be made of a material, e.g., silicon oxide, silicon nitride, and/or silicon oxynitride.

In one embodiment, the first dielectric layer can include a first silicon oxide layer, a silicon nitride layer on the surface of the first silicon oxide layer, and a second silicon oxide layer on the surface of the silicon nitride layer, to form an oxide-nitride-oxide (ONO) structure. After the first silicon oxide layer is formed, a control gate, a word line layer, or a source line layer can be formed on the surface of the first dielectric layer. The control gate, the word line layer, and the source line layer can be used for forming a flash memory cell.

In various embodiments, after a polishing process is performed for a device layer on the surface of a substrate and isolation structures to expose the surface of the isolation structures, residue on the surface of the device layer and on the surface of the isolation structures can be removed using a dry treatment process. Because the polishing rate for the device layer can be substantially the same as the polishing rate for the isolation structures during the polishing process, the residue, i.e., material of a floating gate layer or the device layer, can remain on the surface of the isolation structures. The dry treatment process can remove the residue on the surface of the isolation structures, and thus can ensure desired electrical isolation between adjacent device layers. Meanwhile, the residue on the surface of the isolation structures can be removed using the dry treatment process, so the size of the device layer can be substantially unaffected. Thus, uniformity of the device layer over an entire wafer surface can be improved. Moreover, after the dry treatment process, the surface of the device layer and the isolation structures can be substantially smooth, which is beneficial for processes subsequently performed on the surface of the device layer and the isolation structures.

Various embodiments also provide certain semiconductor structures. For example, referring to FIG. 9, an exemplary semiconductor structure can include a substrate 200, a device layer 203 on the substrate 200. Optionally, a second dielectric layer 202 can be formed between the device layer 203 and the substrate 200. The semiconductor structure can further include a plurality of isolation structures 201 passing through the device layer 203 and the substrate 200. There is substantially no residue of the device layer 203 on the top surface of the isolation structures 201 or on the top surface of the device layer 203. The top surface of the isolation structures 201 and the top surface of the device layer 203 can be substantially leveled and smooth. The semiconductor structure can be formed using methods similar to, or the same as, the methods described in various disclosed embodiments (e.g., FIG. 6-12).

Optionally, the semiconductor structure can further include a first dielectric layer formed on the surface of the device layer 203. A control gate, a word line layer, or a source line layer can be formed on the surface of the first dielectric layer. The control gate, the word line layer, and the source line layer can be used for forming a flash memory cell.

In certain embodiments, methods of forming a floating gate are provided. In an exemplary method, a substrate is provided. The substrate has a plurality of isolation structures therein.

For example, a process of forming the isolation structures can include the following steps. A mask layer can be formed on the surface of the substrate. The mask layer can expose positions corresponding to the isolation structures that are to be formed. The substrate can then be etched using the mask layer as an etch mask, to form trenches in the substrate. An isolation layer can be formed in the trenches to substantially fill the trenches. The isolation layer can be polished using a CMP process such that the surface of the mask layer is exposed, to form the isolation structures in the trenches. After the process of polishing the isolation layer, the mask layer can be removed. In this case, the mask layer can be made of a material, e.g., silicon nitride. The isolation structures can be made of a material, e.g., silicon oxide.

Next, a device layer, i.e., a floating gate layer can be deposited on the surface of the substrate and the surface of the isolation structures. The floating gate layer can be made of a material, e.g., polysilicon. The floating gate layer can be polished using a chemical mechanical polishing process, to remove the floating gate layer above the top of the isolation structures and to expose the top surface of the isolation structures. A dry treatment process, i.e., a dry surface etching treatment, can be performed on the floating gate and the isolation structures, such that residue can be removed.

Optionally, an oxidation process can be performed to form a re-oxidation layer on the floating gate layer. The re-oxidation layer can include silicon oxide. The re-oxidation layer on the floating gate layer can then be removed using a wet cleaning process.

By using the method as disclosed, the surface of the floating gate layer can thus be refreshed. As a result, when an oxide-nitride-oxide (ONO) structure is subsequently disposed to form a flash memory cell, the ONO structure can have desired uniformity.

Optionally, during the chemical mechanical polishing process for removing the floating gate layer above the top of the isolation structures, the polishing rate for the floating gate layer (i.e., polysilicon) can be substantially the same as the polishing rate for the isolation structures (i.e., silicon oxide). That is, the chemical mechanical polishing process has substantially no selectivity between polysilicon and silicon oxide.

Optionally, the dry treatment process can be based on fluorine etching. During the dry treatment process, the polishing rate for the floating gate layer (i.e., polysilicon) can be substantially the same as the polishing rate for the isolation structures (i.e., silicon oxide). That is, the dry treatment process has substantially no selectivity between polysilicon and silicon oxide.

Optionally, the wet cleaning process for removing the re-oxidation layer can remove a thickness of the re-oxidation layer that ranges from about 10 Å to about 40 Å. Optionally, the dry treatment process can etch the floating gate layer and the isolation structures by a thickness amount ranging from about 30 Å to about 80 Å.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:
   providing a substrate having a plurality of isolation structures, a top surface of the plurality of isolation structures being higher than a surface of the substrate;
   forming a device layer on the substrate and on the plurality of isolation structures;
   polishing the device layer using a polishing process, such that the top surface of the plurality of isolation structures are exposed, with residue remaining on the device layer and on the plurality of isolation structures; and
   removing the residue from the device layer and from the plurality of isolation structures using a non-polishing-removal process, such that the top surface of the plurality of isolation structures and a top surface of the device layer are substantially leveled and smooth, wherein the non-polishing-removal process reduces a thickness of the device layer and a thickness of the plurality of isolation structures by a thickness amount ranging from about 30 Å to about 80 Å.

2. The method according to claim 1, wherein:
   the plurality of isolation structures are made of silicon oxide, silicon nitride, silicon oxynitride, or a combination thereof; and
   the device layer is made of polysilicon.

3. The method according to claim 2, wherein the non-polishing-removal process includes a dry treatment process, and the dry treatment process has a process gas including a fluorine-containing gas, and has a substantially same etching rate for the device layer and for the plurality of isolation structures.

4. The method according to claim 3, wherein the process gas of the dry treatment process includes Ar, He, $CF_4$, and $CHF_3$, and wherein:
   the Ar has a flow rate ranging from about 100 sccm to about 800 sccm;
   the He has a flow rate ranging from about 50 sccm to about 200 sccm;
   the $CF_4$ has a flow rate ranging from about 20 sccm to about 300 sccm; and
   the $CHF_3$ has a flow rate ranging from about 10 sccm to about 200 sccm.

5. The method according to claim 2, wherein the residue is made of a material containing silicon.

6. The method according to claim 2, wherein the device layer is used to form a floating gate, and the floating gate is used to form a flash memory cell, the method further including:
   after removing the residue using the dry treatment process, forming a first dielectric layer on the device layer; and
   forming a control gate on the first dielectric layer above the device layer.

7. The method according to claim 6, wherein the first dielectric layer includes:
   a first silicon oxide layer;
   a silicon nitride layer on the first silicon oxide layer; and
   a second silicon oxide layer on the silicon nitride layer.

8. The method according to claim 1, further including:
   after removing the residue using the non-polishing-removal process, forming an oxide layer on the device layer and on the isolation structures using a thermal oxidation process; and
   removing the oxide layer.

9. The method according to claim 8, wherein a process for removing the oxide layer includes a wet cleaning process.

10. The method according to claim 8, further including:
    after removing the oxide layer, forming a first dielectric layer on the device layer.

11. The method according to claim 8, wherein the oxide layer has a thickness ranging from about 10 Å to about 40 Å.

12. The method according to claim 1, wherein the polishing process has a substantially same polishing rate for the device layer and for the plurality of isolation structures, the polishing process includes a first polishing process and a second polishing process after the first polishing process, and a polishing rate during the first polishing process is higher than a polishing rate during the second polishing process.

13. The method according to claim 12, wherein:
    the polishing rate during the first polishing process ranges from about 5 Å/sec to about 20 Å/sec; and
    the polishing rate during the second polishing process ranges from about 1 Å/sec to about 5 Å/sec.

14. The method according to claim 1, wherein a process for forming the plurality of isolation structures includes:
    forming a mask layer on the substrate, the mask layer exposing positions corresponding to the plurality of isolation structures to be formed;
    etching the substrate using the mask layer as an etch mask, to form a plurality of trenches in the substrate;
    forming an isolation layer in the plurality of trenches to fill the plurality of trenches;
    polishing the isolation layer such that a surface of the mask layer is exposed, to form the plurality of isolation structures in the plurality of trenches; and
    removing the mask layer.

15. The method according to claim 14, wherein a second dielectric layer is formed between the mask layer and the substrate.

16. A method for forming a semiconductor structure, comprising:
providing a substrate having a plurality of isolation structures, a top surface of the plurality of isolation structures being higher than a surface of the substrate;
forming a device layer on the substrate and on the plurality of isolation structures;
polishing the device layer using a polishing process, such that the top surface of the plurality of isolation structures are exposed, with residue remaining on the device layer and on the plurality of isolation structures, wherein:
the polishing process has a substantially same polishing rate for the device layer and for the plurality of isolation structures,
the polishing process includes a first polishing process and a second polishing process after the first polishing process,
a polishing rate during the first polishing process is higher than a polishing rate during the second polishing process, and
after the first polishing process, a distance between a surface of the device layer and the top surface of the plurality of isolation structures ranges from about 100 Å to about 800 Å; and
removing the residue from the device layer and from the plurality of isolation structures using a non-polishing-removal process, such that the top surface of the plurality of isolation structures and a top surface of the device layer are substantially leveled and smooth.

17. The method according to claim 16, wherein:
the plurality of isolation structures are made of silicon oxide, silicon nitride, silicon oxynitride, or a combination thereof,
the device layer is made of polysilicon, and
the residue is made of a material containing silicon.

18. The method according to claim 15, wherein the non-polishing-removal process includes a dry treatment process, and the dry treatment process has a process gas including a fluorine-containing gas, and has a substantially same etching rate for the device layer and for the plurality of isolation structures.

19. The method according to claim 16, wherein the device layer is used to form a floating gate, and the floating gate is used to form a flash memory cell, the method further including:
after removing the residue using the dry treatment process, forming a first dielectric layer on the device layer; and
forming a control gate on the first dielectric layer above the device layer.

20. The method according to claim 16, further including:
after removing the residue using the non-polishing-removal process, forming an oxide layer on the device layer and on the isolation structures using a thermal oxidation process; and
removing the oxide layer.

* * * * *